(12) United States Patent
Moinian et al.

(10) Patent No.: US 7,847,666 B2
(45) Date of Patent: Dec. 7, 2010

(54) DIFFERENTIAL INDUCTOR FOR USE IN INTEGRATED CIRCUITS

(75) Inventors: Shahriar Moinian, New Providence, NJ (US); John E. Scoggins, Dover, NH (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/535,501

(22) Filed: Sep. 27, 2006

(65) Prior Publication Data
US 2008/0074229 A1 Mar. 27, 2008

(51) Int. Cl.
*H01F 5/00* (2006.01)
(52) U.S. Cl. .................. 336/200; 336/223; 336/232
(58) Field of Classification Search ............. 336/200, 336/223, 232
See application file for complete search history.

(56) References Cited

U.S. PATENT DOCUMENTS

| | | | |
|---|---|---|---|
| 6,476,704 B2 | 11/2002 | Goff | |
| 6,667,217 B1 | 12/2003 | Hsu et al. | |
| 6,759,937 B2 * | 7/2004 | Kyriazidou | 336/200 |
| 6,927,664 B2 * | 8/2005 | Nakatani et al. | 336/200 |
| 7,039,381 B2 | 5/2006 | Yang et al. | |
| 2003/0160299 A1 * | 8/2003 | Contopanagos et al. | 257/531 |

OTHER PUBLICATIONS

V. Minerva, "A Compact Differential Inductor with Improved Self-Resonance Frequency," Proceedings of the German Microwave Conference, pp. 29-32, 2005.

S-M. Yim et al., "The Effects of a Ground Shield on Spiral Inductors Fabricated in a Silicon Bipolar Technology," Bipolar/BiCMOS Circuits and Technology Meeting, 2000, Proceedings of the 2000, pp. 157-160.

C-H Wu et al., "Selective Metal Parallel Shunting Inductor and Its VCO Application," IEEE Transactions on Circuits and Systems, Regular Papers, vol. 52, No. 9, pp. 1811-1818, Sep. 2005.

A. Zolfaghari et al., "Stacked Inductors and Transformers in CMOS Technology," IEEE Journal of Sold-State Circuits, vol. 36, No. 4, pp. 620628, Apr. 2001.

H.Y.D. Yang, "Design Considerations of Differential Inductors in CMOS Technology," Radio Frequency Integrated Circuits (RFIC) Symposium, Digest of Papers, IEEE, 4 pages, 2004.

* cited by examiner

*Primary Examiner*—Anh T Mai
*Assistant Examiner*—Joselito Baisa
(74) *Attorney, Agent, or Firm*—Ryan, Mason & Lewis, LLP

(57) ABSTRACT

An inductor device in an integrated circuit includes a first winding portion, a bridge portion and a second winding portion. The integrated circuit has a first, a second, a third and a fourth metallization level. The first winding portion comprises a first metal line formed on the first metallization level and a second metal line formed on the second metallization level, the first metal line being electrically connected in parallel with the second metal line. The bridge portion comprises a third metal line formed on the third metallization level and a fourth metal line formed on the fourth metallization level, the third metal line being electrically connected in parallel with the fourth metal line. The second winding portion comprises a fifth metal line formed on the first metallization level and a sixth metal line formed on the second metallization level, the fifth metal line being electrically connected in parallel with the sixth metal line. The bridge portion electrically connects the first winding portion to the second winding portion.

21 Claims, 7 Drawing Sheets

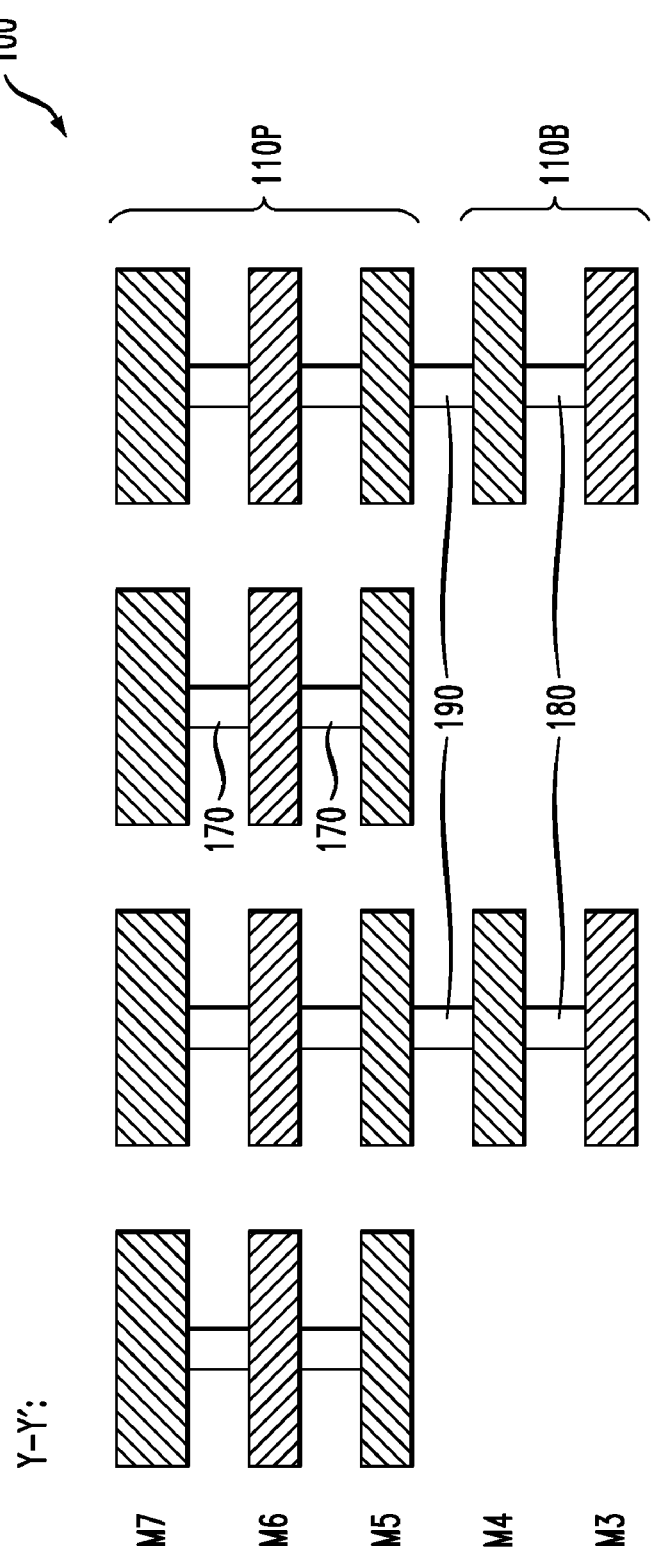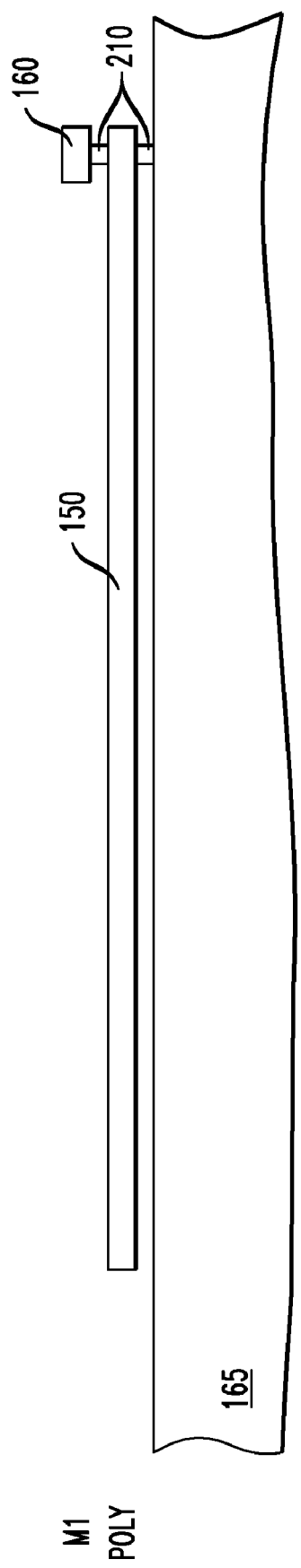
FIG. 5

DIFFERENTIAL INDUCTOR FOR USE IN INTEGRATED CIRCUITS

FIELD OF THE INVENTION

The present invention is directed to integrated circuits, and, more particularly, to inductor devices in integrated circuits.

BACKGROUND OF THE INVENTION

Inductor devices are extensively used in radio frequency integrated circuits (RFICs) and microwave monolithic integrated circuits (MMICs). Inductor devices are, for example, a primary component in inductance-capacitance voltage-controlled oscillator (LC-VCO) devices in these types of integrated circuits. An LC-VCO is an electronic oscillator specifically designed to be controlled in oscillation frequency by a voltage input. Typically, the one or more inductor devices in an LC-VCO are fabricated on the same substrate as the rest of the oscillator circuitry. For this reason, the area that an inductor device occupies on the integrated circuit and its ease of manufacture are major design considerations for the inductor device in addition to the inductor device's quality factor (Q-factor) and inductance value.

LC-VCOs in high-performance analog and mixed signal RFICs and MMICs are typically operated in a differential signal mode. In a differential signal mode, an LC-VCO produces two signals with a 180-degree phase difference. An important advantage of differential signal operation over single signal operation is its common mode rejection which results in greater immunity to environmental noise. In differential signal operation, two symmetric inductor devices are frequently used in a single LC-VCO. More recently, however, differential inductor devices have been utilized for differential signal operations. While comprising only a single winding, a differential inductor can be treated as two single-ended inductor devices that are symmetrically wound together. This winding together effectively causes the magnetic fluxes induced by the two out-of-phase signals to be added together (i.e. causes mutual inductance). Differential inductor devices therefore need about half of the central empty area (i.e., inductor core) required by a conventional inductor. Moreover, the Q-factor of a differential inductor device is typically significantly higher than that of a conventional inductor (i.e., up to about 50%) due to reduced interactions between the differential inductor device and the underlying semiconductor substrate.

Nevertheless, on-chip differential inductor devices have in the past typically been formed with specialized structures that are specific to the inductor devices and are not used in the remainder of the integrated circuit. For example, differential on-chip inductor devices have frequently required unconventionally thick metal lines in order to reduce their overall electrical resistance and improve their Q-factor. These specialized structures require additional processing over that required to form the remainder of the integrated circuit, adding considerable cost to the production of the integrated circuit. There is a need, as a result, for high Q-factor on-chip differential inductor device designs that can be produced in a conventional integrated circuit without the need for more processing steps than those required to form the remainder of the integrated circuit.

SUMMARY OF THE INVENTION

Embodiments of the present invention address the above-identified need by providing high Q-factor on-chip differential inductor devices. Advantageously, many of these embodiments may be formed in a conventional integrated circuit without the need for more processing steps than those required to form the remainder of the integrated circuit.

In accordance with an aspect of the invention, an inductor device in an integrated circuit includes a first winding portion, a bridge portion and a second winding portion. The integrated circuit has a first, a second, a third and a fourth metallization level. The first winding portion of the inductor device comprises a first metal line formed on the first metallization level and a second metal line formed on the second metallization level, the first metal line being electrically connected in parallel with the second metal line. The bridge portion comprises a third metal line formed on the third metallization level and a fourth metal line formed on the fourth metallization level, the third metal line being electrically connected in parallel with the fourth metal line. Finally, the second winding portion comprises a fifth metal line formed on the first metallization level and a sixth metal line formed on the second metallization level, the fifth metal line being electrically connected in parallel with the sixth metal line. The bridge portion electrically connects the first winding portion to the second winding portion.

In accordance with an illustrative embodiment of the invention, an inductor device in an integrated circuit comprises a single, octagonal winding that terminates in two nodes. The inductor winding, in turn, can be separated into primary winding portions and bridge portions. The bridge portions allow the inductor winding to cross-over itself and to be electrically continuous from one node to the other node. The primary winding portions comprise metal lines on three metallization levels that are connected in parallel with each other by a multiplicity of contact vias. The bridge portions, in turn, comprise metal lines on two metallization levels that are also electrically coupled to each other in parallel using a multiplicity of contact vias. A center-tap node contacts the inductor winding at its geometric center point. Several shielding portions act to improve the performance of the illustrative inductor device by reducing the interaction of the inductor device with the underlying semiconductor substrate and other nearby circuit devices.

Advantageously, the illustrative inductor device is characterized by a relatively high Q-factor. Moreover, the inductor device may be formed at the same time other circuit devices are formed in the remainder of the integrated circuit.

These and other features and advantages of the present invention will become apparent from the following detailed description which is to be read in conjunction with the accompanying drawings.

BRIEF DESCRIPTION OF THE DRAWINGS

FIG. 5 shows a sectional view of the FIG. 1 inductor device cut along the plane Y-Y'.

DETAILED DESCRIPTION OF THE INVENTION

The present invention will be illustrated below in conjunction with an illustrative embodiment of an on-chip inductor device. It should be understood, however, that the invention is not limited to the particular arrangement of features shown in the illustrative embodiment. For example, an embodiment within the scope of this invention may comprise features having different compositions and/or shapes from the features shown herein. These and other modifications to the illustrative embodiment falling within the scope of the invention will become apparent to one skilled in the art in light of the following detailed description.

Figure 1:
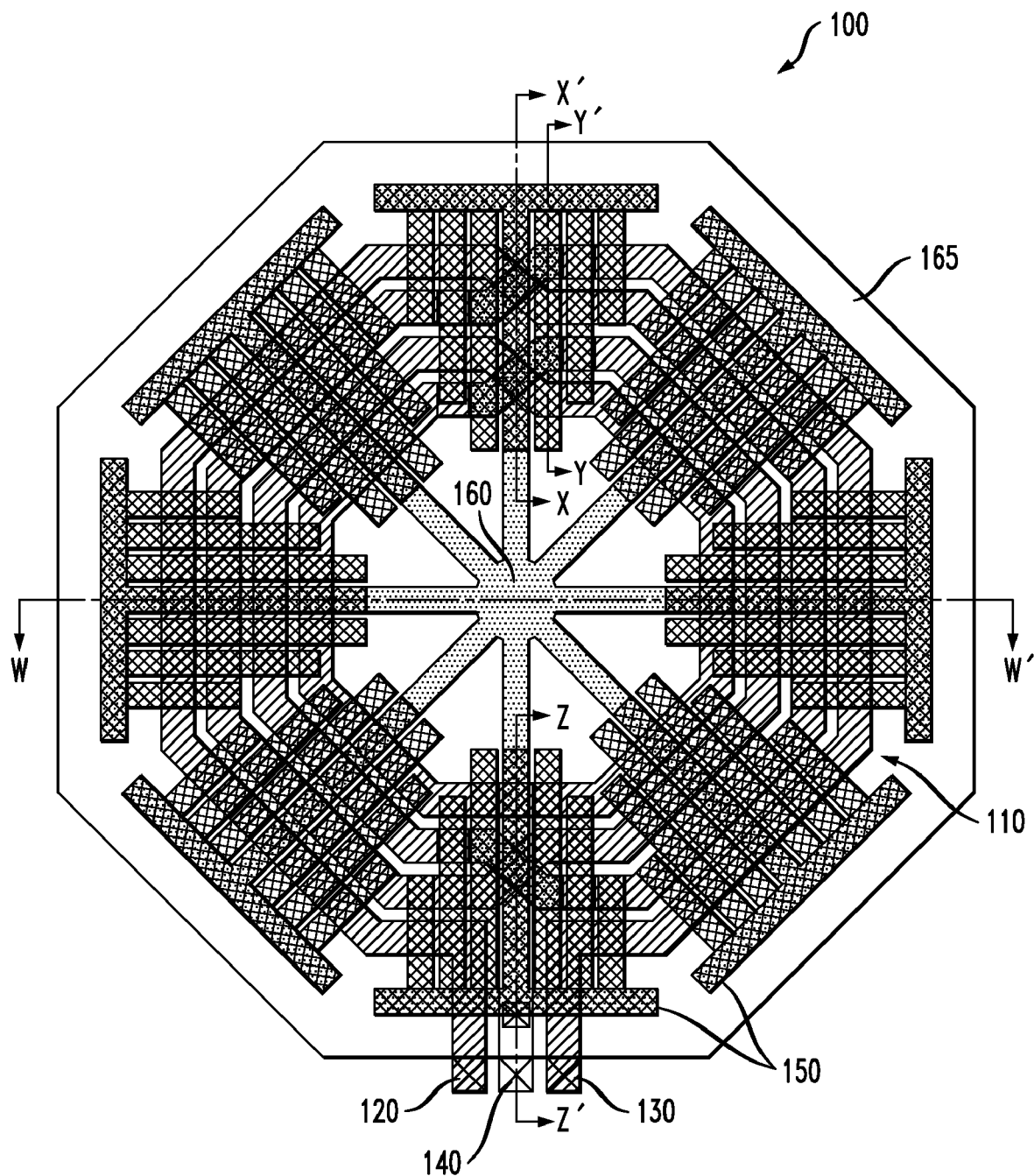
FIG. 1 shows a plan view of an inductor device in accordance with an illustrative embodiment of the invention.
Figure 2:
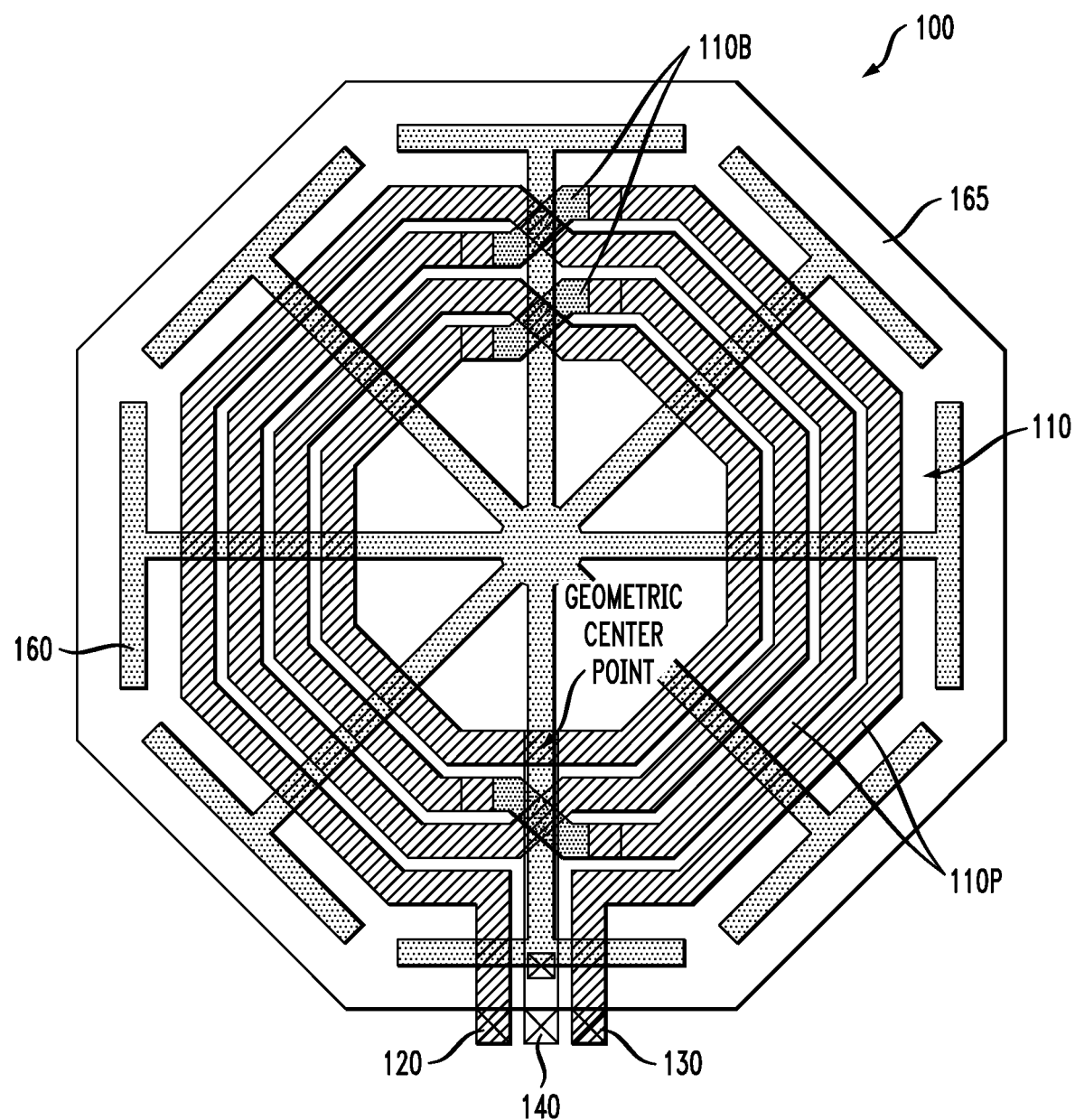
FIG. 2 shows a plan view of the FIG. 1 inductor device with the polysilicon shielding portions removed.
Figure 3:
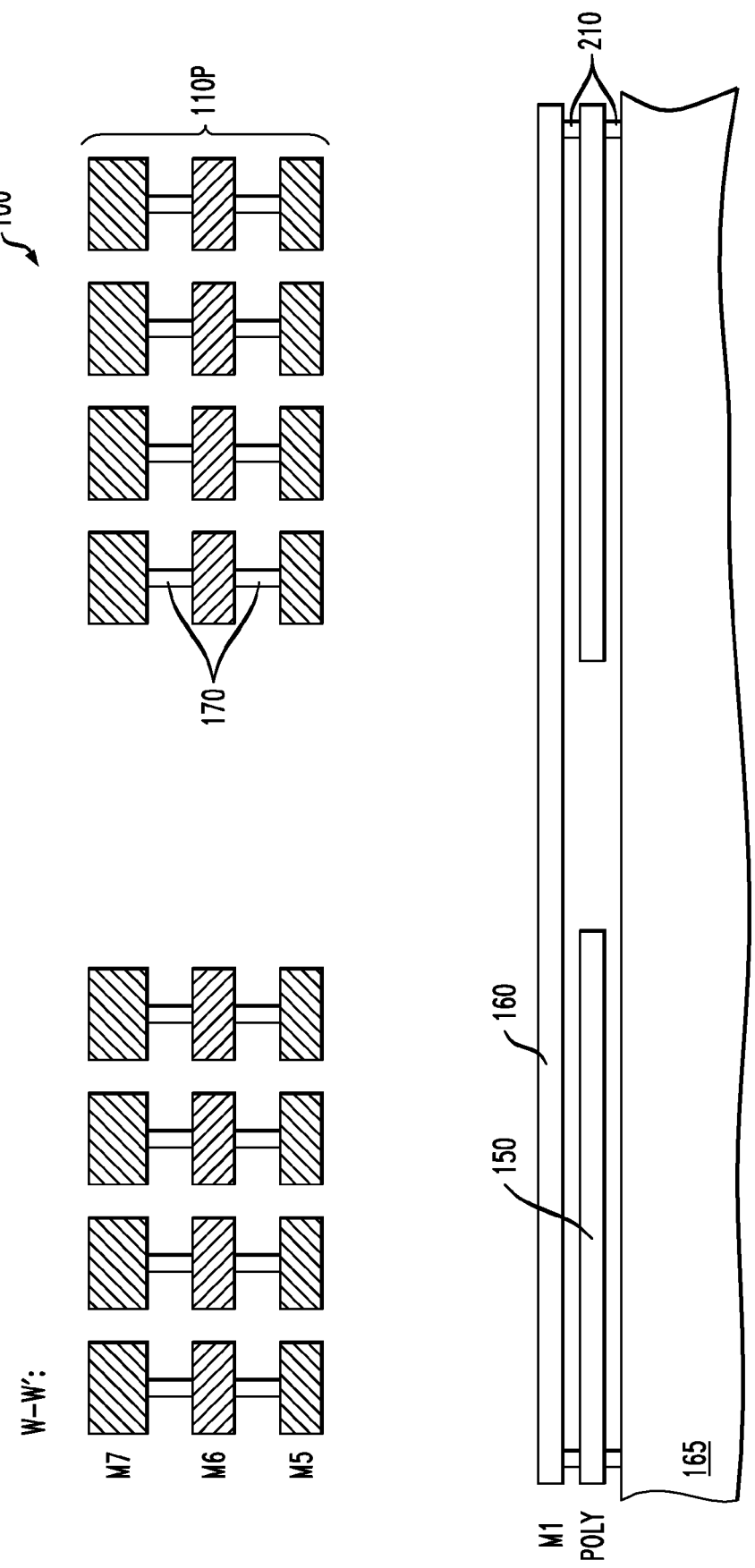
FIG. 3 shows a sectional view of the FIG. 1 inductor device cut along the plane W-W'.
Figure 4:
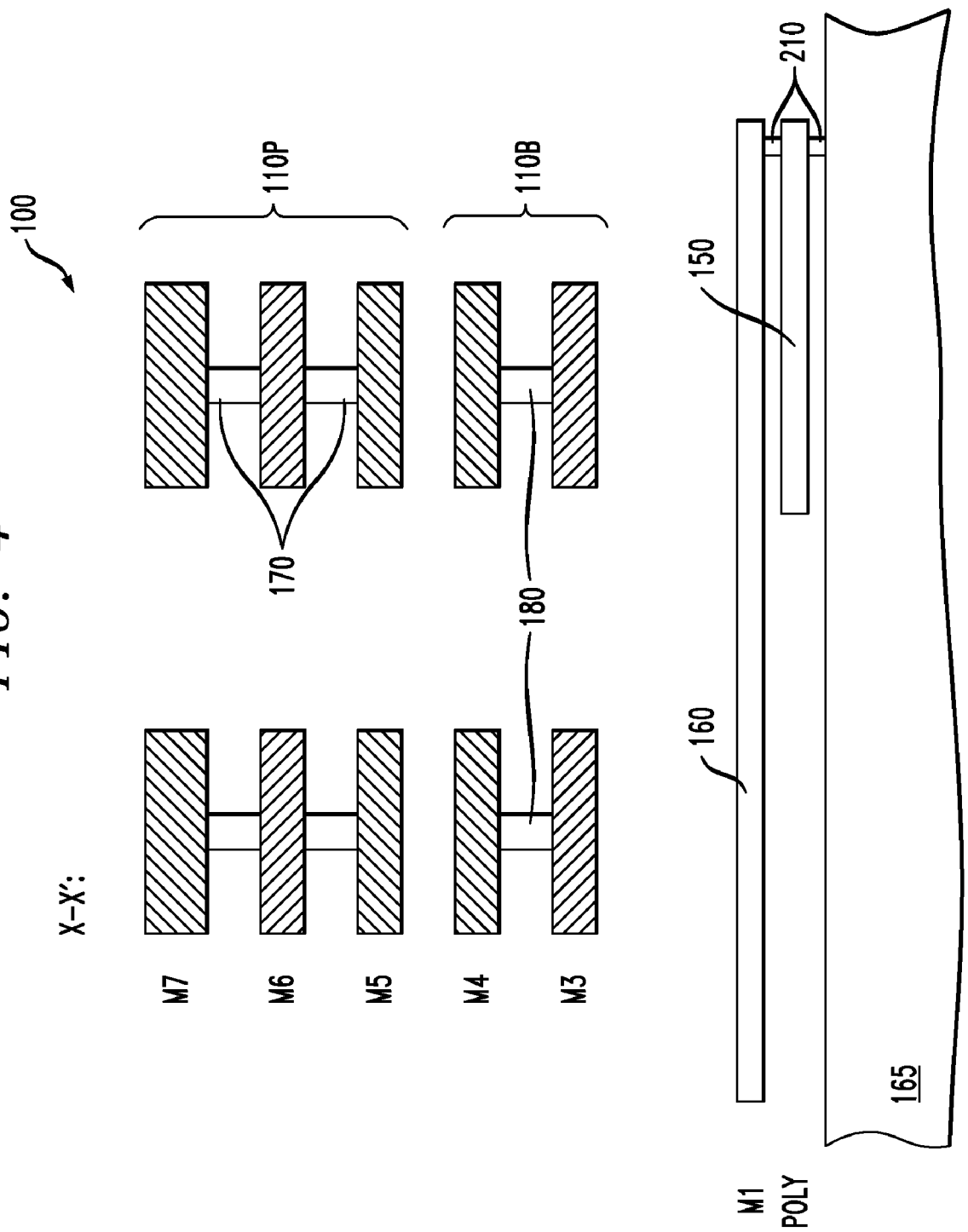
FIG. 4 shows a sectional view of the FIG. 1 inductor device cut along the plane X-X'.
Figure 6:
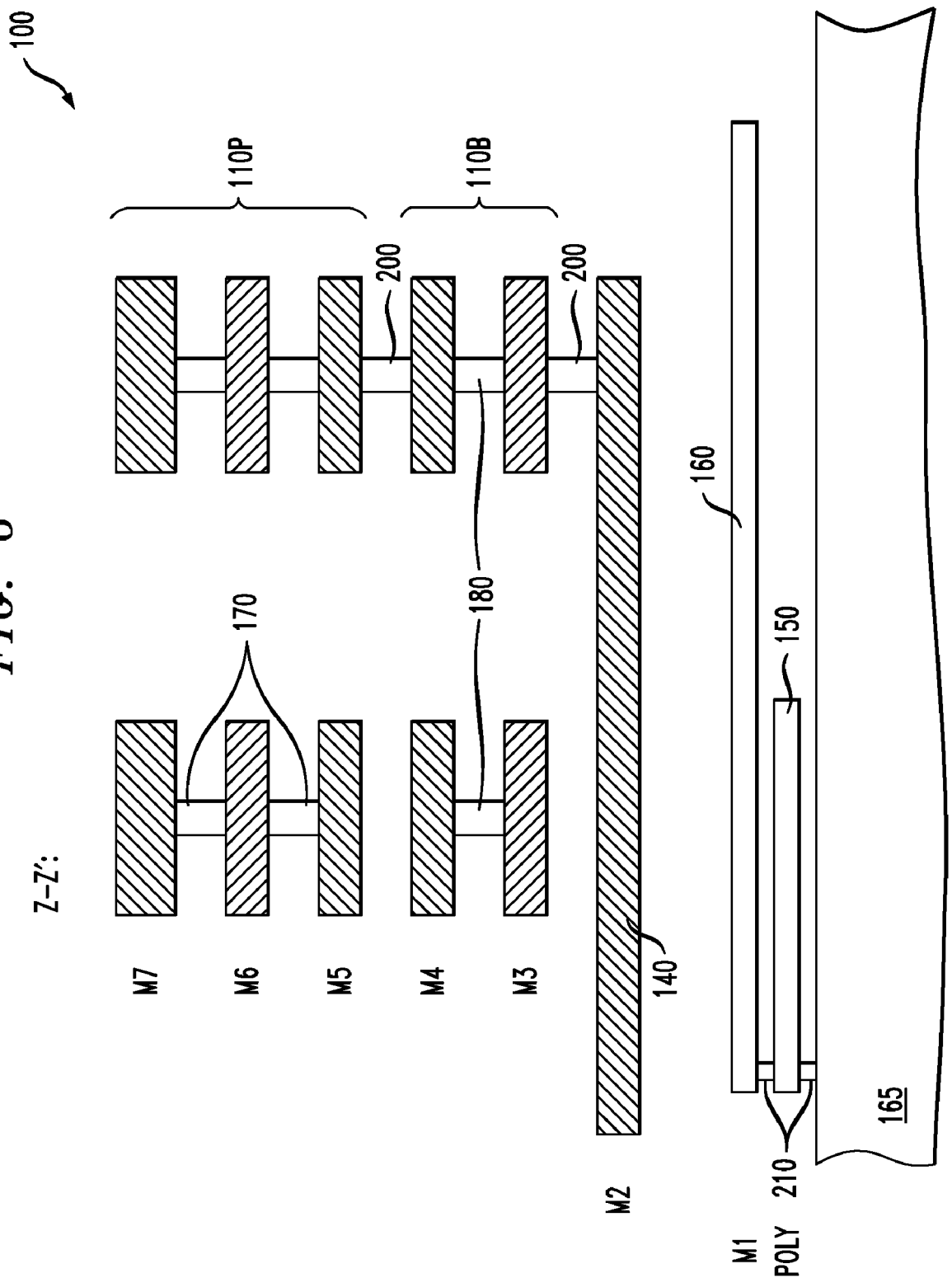
FIG. 6 shows a sectional view of the FIG. 1 inductor device cut along the plane Z-Z'.

FIGS. 1-6 combine to show an illustrative on-chip inductor device 100 comprising aspects of the present invention. FIG. 1, for example shows a plan view of the inductor device. For increased clarity, FIG. 2 shows the same illustrative inductor device with its polysilicon shielding portions (detailed below) removed. FIG. 3-6 show sectional views of the illustrative inductor device cut along the planes W-W', X-X', Y-Y' and Z-Z', respectively, indicated in FIG. 1.

Reference to the plan views in FIGS. 1 and 2 clearly shows that the illustrative inductor device 100 comprises a single, octagonal inductor winding 110 that terminates in a left signal node 120 and a right signal node 130. The inductor winding, in turn, can be separated into primary winding portions 110P and bridge portions 110B. The bridge portions allow the inductor winding to cross-over itself and to be electrically continuous from the left node to the right node. A center-tap node 140, contacts the inductor winding at its geometric center point. Several polysilicon shielding portions 150 and an M1 shield connecting portion 160 act to improve the performance of the illustrative inductor device. The inductor device overlies a semiconductor substrate 165.

One skilled in the art will recognize that the illustrative inductor device 100 may be operated as a differential inductor. The center-tap node 140 may, for example, be held at a reference potential while differential signals (i.e., signals that are 180 degrees out-of-phase) are applied to the left and right nodes 120, 130. Advantageously, the shape of the inductor winding 110 and the location of the center-tap node effectively cause the magnetic fluxes induced by the two out-of-phase signals to be combined. In other words, the magnetic flux due to current flow through that part of the inductor winding stretching from the left signal node to the center-tap node effectively adds to the magnetic flux due to current flow through that part of the inductor winding stretching from the right signal node to the center-tap node. As a result, only about half of the central space within the illustrative inductor (i.e., the inductor device's core region) is required to achieve a given inductance value when compared to a non-differential inductor device of the same inductance value. The differential inductor design embodied in the illustrative inductor device also helps to assure that the inductance values found on the two signal nodes are substantially the same.

Reference now to the various sectional views in FIGS. 3-6 shows that illustrative inductor device 100 is built into a polysilicon level (labeled as the "POLY" level in the figures) and seven metallization levels (labeled "M1" through "M7" in the figures). The primary winding portions 110P of the inductor winding 110 comprise metal lines built into the M5-M7 metallization levels. The bridge portions 110B, on the other hand, comprise metal lines built into the M3 and M4 metallization levels. The center-tap node 140 comprises a metal line built into the M2 metallization level. The polysilicon shielding portions 150 comprise polysilicon lines fanned in the POLY level, while the M1 shield connecting portion 160 comprises metal lines built into the M1 metallization level.

It will be observed that, in accordance with aspects of the invention, the metal lines forming the primary winding portions 110P are electrically connected together by a multiplicity of contact vias 170 so that they are connected in parallel with each other (i.e., they are shunted). The metal lines forming the bridge portions 110B are electrically connected in parallel with each other in a similar fashion using a multiplicity of contact vias 180. The primary winding portions are electrically connected to the bridge portions at those places in the inductor winding where the inductor winding will cross-over itself with a multiplicity of contact vias 190. The center-tap node 140 is electrically connected to the inductor winding 110 at the winding's geometric center through several contact vias 200 that interconnect the metal line at the M2 metallization level and the metal lines in the M3-M7 metallization levels. The polysilicon shielding portions 150 and M1 shield connecting portion 160 are electrically connected to each other and to the semiconductor substrate by a multiplicity of contact vias 210.

A standard metric for determining the performance of an inductor device is the inductor device's quality factor, Q-factor. The Q-factor of an inductor is given by the formula:

$$Q = \frac{\text{energy stored}}{\text{energy loss in one oscillation cycle}} = \frac{\omega L}{R}$$

where $\omega$ is the resonant angular frequency of the inductor, L is the inductance and R is the resistance of the inductor. The Q-factor is therefore a measure of the efficiency of an inductor. It may have a value of several hundred in a relatively efficient inductor device.

Advantageously, inductor embodiments of the present invention may be characterized by relatively high Q-factors. The resistance value, R, of the inductor device 100 is a function of both the resistance of the interconnect features that form the inductor winding 110 itself (i.e., metal lines and contact vias) as well as substrate losses due to the interaction of the inductor winding with the underlying semiconductor substrate 165. The losses to the semiconductor substrate occur predominantly because the magnetic fields generated by the inductor device induce eddy currents in the semiconductor substrate while the electric fields generated by the inductor device induce conduction and displacement currents in the semiconductor substrate.

As described above, in the illustrative inductor device 100, both the primary winding portions 110P and the bridge portions 110B of the inductor winding 110 each comprise multiple metal lines connected together in parallel by a multiplicity of contact vias 170, 180. More particularly, the primary winding portions include three shunted metal lines while the bridge portions include two shunted metal lines. By wiring these portions in this way, the overall resistance of the inductor winding may be reduced to a value substantially below that which would be present if these portions only consisted of single metal lines. The Q-factor of the inductor device is thereby increased. Of course, if additional metallization layers beyond those illustrated herein are available, it is preferable that additional metal lines also be coupled with the primary winding and bridge portions to further decrease the series resistances of these portions.

The effect of substrate loss, moreover, is addressed by including the polysilicon shielding portions 150 and the M1 shield connecting portion 160 in the inductor device 100. The polysilicon shielding portions each comprise a line-shaped portion from which extends several fingers. These fingers, in turn, are densely packed into the region between the inductor winding 110 and the semiconductor substrate 165. The fingers are perpendicular to the inductor turns to cancel out induced magnetic eddy currents from the inductor device. The M1 shielding portion, on the other hand, comprises a center portion out of which radiate a plurality of bars. These bars end in metal lines that run along the periphery of the inductor device.

Both the polysilicon shielding portions 150 and M1 shield connection portion 160 are preferably set to the ground potential for the integrated circuit while the inductor device 100 is operating. In the inductor device these connections to ground are provided by the contact vias 190 which contact portions of the semiconductor substrate 165 that are at ground potential. The polysilicon shielding portions provide a return path to ground near the semiconductor substrate and prevent some of the magnetic and electric fields generated by the inductor device to penetrate into the semiconductor substrate. Substrate losses are thereby reduced when compared to an inductor device without any kind of ground shield structures. The M1 shielding portion electrically and magnetically isolates the inductor device from other nearby circuit devices. Polysilicon and M1 shielding portions like those illustrated herein have been experimentally shown to substantially improve the Q-factor of an associated inductor device, although an inductor device need not have shielding portions identical to those illustrated herein to fall within the scope of this invention.

Figure 7:
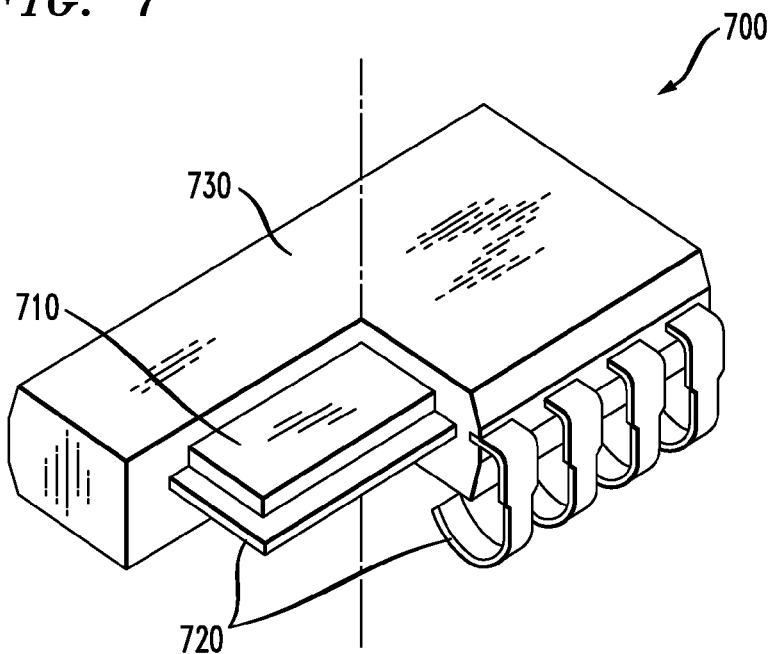
FIG. 7 shows a perspective view of a packaged integrated circuit embodying features of the invention with the package partially cut away.

An inductor device of the type described above may be implemented in an integrated circuit. The formation of integrated circuits will be familiar to one skilled in the art. A plurality of identical die are typically formed in a repeated pattern on a surface of a semiconductor wafer. Each die includes an inductor device comprising aspects of the invention, and may include other structures or circuits. The individual die are cut or diced from the semiconductor wafer, then packaged as an integrated circuit. FIG. 7, for example, shows a packaged integrated circuit 700 comprising an inductor device in accordance with aspects of this invention. The integrated circuit is in a conventional plastic leadframe package. The packaged integrated circuit comprises a die 710 attached to a leadframe 720. A plastic mold 730 encapsulates the die and a portion of the leadframe. One skilled in the art would know how to dice wafers and package die to produce integrated circuits.

In order to reduce the complexity and cost of manufacturing an integrated circuit comprising an inductor device in accordance with aspects of the invention, the inductor device will preferably be formed at the same time other circuit elements are formed in the integrated circuit. Complimentary metal-oxide-semiconductor (CMOS) technology is a common technology for forming RFICs and MMICs. CMOS RFICs and MMICs, for example, frequently comprise a polysilicon level and seven or more metallization levels. Outside of the inductor device, the polysilicon level is typically the level in which gate conductors for metal-oxide-semiconductor field effect transistors are formed. The seven or more metallization levels, in turn, typically provide the interconnection between circuit elements. Accordingly, forming an inductor device in accordance with aspects of this invention may not require more processing steps than are required to form the remainder of the integrated circuit.

The formation of circuit devices using CMOS technology will be familiar to one skilled in the art and is described in a number of readily available references including, for example, S. Wolf et al., Silicon Processing for the VLSI Era, Volumes 1-3, Lattice Press, 1986, 1990 and 1995, which are incorporated herein by reference. Features in the polysilicon level, including the polysilicon shielding portions 150, may be formed by depositing a blanket layer of polysilicon and patterning the polysilicon using conventional lithography and reactive ion etching (RIE) techniques. The various contact vias, including the contact vias 170, 180, 190, 200 and 210, moreover, may be formed by first depositing a layer of insulating material (e.g., silicon dioxide) and then using conventional lithography and RIE techniques to form holes in the insulating layer in those places where contact vias are desired. The appropriate conductive material (e.g., polysilicon or a metal) is then conformally deposited into the holes and any excess conductive material is removed from the top of the insulating layer using conventional chemical mechanical polishing (CMP) techniques.

Features in the metallization levels, including the M1 shield connecting portion 160 and the metal lines constituting the inductor winding 110, may be formed by depositing a blanket layer of metal and patterning the metal using conventional lithography and RIE techniques in a manner similar to that described above for forming polysilicon features. Alternatively, in a manner similar to that described above for forming contact vias, the metal lines may be formed by first depositing a layer of insulating material (e.g., silicon dioxide) and then using conventional lithography and RIE techniques to form trenches in the insulating layer in the shape of the desired metal lines. The chosen metal is then conformally deposited into the trenches and any excess metal is removed from the top of the insulating layer, again using conventional CMP techniques. The latter method for forming metal lines is conventionally called a "damascene" process.

It is generally recognized that a circular inductor winding shape results in the highest Q-factor. Nevertheless, circular features are typically not easily realized with conventional CMOS processing largely due to limitations in lithography techniques. As a result, the inductor winding 110 in the inductor device 100 has a substantially octagonal shape which comes close to a circular shape but is easily achieved using conventional CMOS processing. It should be recognized, nevertheless, that the scope of this invention is not limited to this particular octagonal shape. Alternative shapes for an inductor winding may include, for example, squares, rectangles and hexagons.

Figure 8:
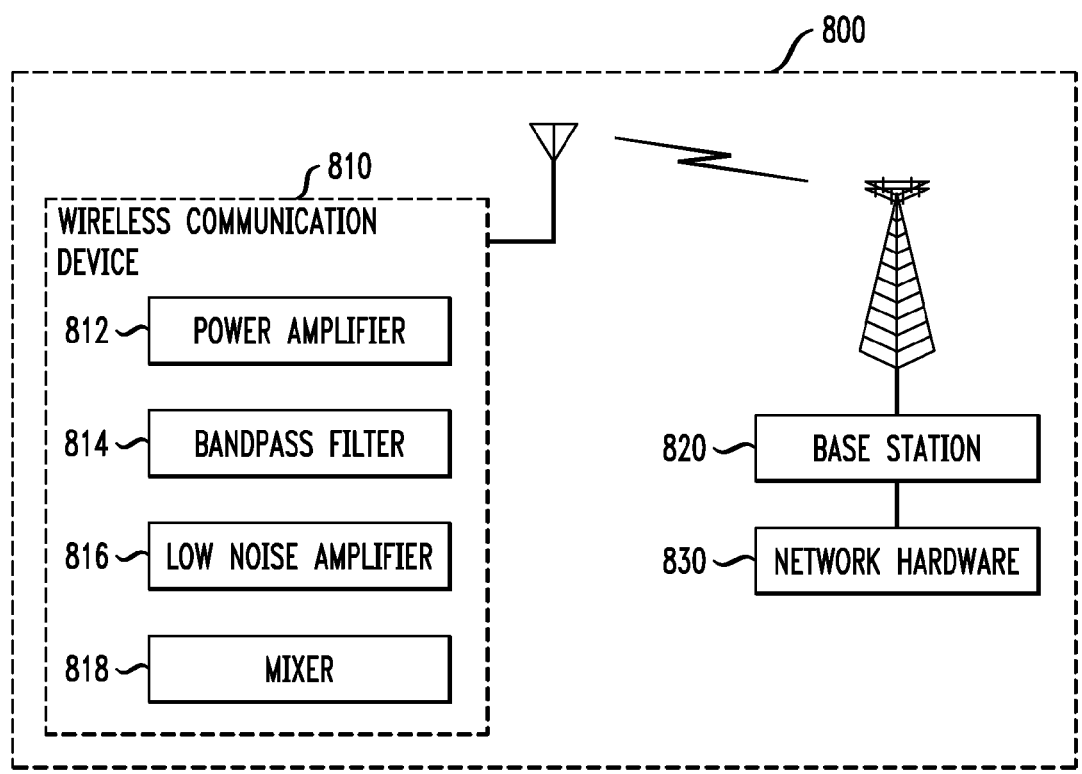
FIG. 8 shows a block diagram of a telecommunications system embodying features of the invention.

One skilled in the art will recognize that embodiments of this invention may be useful in a wide variety of electronic systems such as telecommunications systems. FIG. 8 shows a block diagram of an illustrative telecommunications system 800 comprising a wireless communication device 810, a base station 820, and a network hardware component 830. The wireless communication device communicates wirelessly with the base station, allowing the wireless communication device to access the network hardware component. The wireless communication device may be a laptop computer, cellular telephone, two-way radio or any one of several other devices capable of wireless communications.

FIG. 8 further shows that the illustrative wireless communication device 810 comprises a power amplifier 812, a bandpass filter 814, a low noise amplifier 816 and a mixer 818. One skilled in the art will recognize that, in modern wireless communication devices, these components typically comprise inductor devices that are operated in a differential signal mode. As a result, each of these components may be implemented using on-chip differential inductor devices in accordance with the teachings of the present invention. Of course, the wireless communication device will also likely comprise several other electronic components that are not explicitly shown in the figure (e.g., digital processing module, memory and analog-to-digital converter). These other components and their functions will be familiar to one skilled in the art.

It should again be emphasized that the above-described embodiments of the invention are intended to be illustrative only. Other embodiments can use different types and arrangements of elements for implementing the described functionality. These numerous alternative embodiments within the scope of the following claims will be apparent to one skilled in the art.

What is claimed is:

1. An inductor device in an integrated circuit having a first, a second, a third and a fourth metallization level, the inductor device including:
   a first winding portion;
   a second winding portion;
   a first bridge portion electrically the first winding portion to the second winding portion;
   a third winding portion; and
   a second bridge portion electrically connecting the second winding portion to the third winding portion;
   wherein the first winding portion and the second winding portion are substantially concentric in a plan view such that the first winding portion is substantially completely surrounded in the plan view by the second winding portion;
   wherein the second winding portion and the third winding portion are substantially concentric in the plan view such that the second winding portion is substantially completely surrounded in the plan view by the third winding portion;
   wherein each winding portion comprises a first metal line formed on the first metallization level and a second metal line formed on the second metallization level, the first metal line of a given winding portion being connected in parallel with the second metal line of the given winding portion; and
   wherein each bridge portion comprises a first metal line formed on the third metallization level and a second metal line formed on the fourth metallization level, the first metal line of a given bridge portion being connected in parallel with the second metal line of the given bridge portion.

2. The inductor device of claim 1, wherein the inductor device comprises a differential inductor.

3. The inductor device of claim 1, wherein the first metal line of the given winding portion is electrically connected to the second metal line of the given winding portion by at least one contact via.

4. The inductor device of claim 1, wherein the first metal line of the given bridge portion is electrically connected to the second metal line of the given bridge portion by at least one contact via.

5. The inductor device of claim 1, wherein at least part of at least one of the first winding portion and the second winding portion overlies at least part of the first bridge portion.

6. The inductor device of claim 1, wherein the integrated circuit further comprises a fifth metallization level, and each winding portion comprises a third metal line formed on the fifth metallization level, the third metal line of the given winding portion being electrically connected in parallel with the first and second metal lines of the given winding portion.

7. The inductor device of claim 1, wherein the first, the second, the third and the fourth metallization levels overlie a fifth metallization level and the inductor device further comprises a shield connection portion formed on the fifth metallization level, the shield connection portion being coupled to a plurality of shielding portions, the shielding portions being disposed between the fifth metallization level and a semiconductor substrate.

8. The inductor device of claim 7, wherein the one or more shielding portions are coupled to a ground potential of the integrated circuit.

9. The inductor device of claim 7, wherein at least one of the one or more shielding portions comprises polysilicon.

10. The inductor device of claim 7, wherein the shield connection portion comprises:
    a center portion; and
    a plurality of extensions, the plurality of extensions attached to and radiating outward from the center portion;
    wherein the plurality of extensions are coupled to respective ones of the shielding portions.

11. The inductor device of claim 10, wherein a given one of the plurality of shielding portions comprises:
    a line-shaped portion substantially normal to a long axis of a corresponding one of the extensions;
    a plurality of fingers, the plurality of fingers attached to and extending from the line-shaped portion.

12. The inductor device of claim 11, wherein each of the plurality of fingers extends from the line-shaped portion in a direction substantially normal to a long axis of the line-shaped portion.

13. The inductor device of claim 1, wherein the integrated circuit comprises at least seven metallization levels.

14. The inductor device of claim 1, wherein the integrated circuit is packaged.

15. The inductor device of claim 1, wherein the integrated circuit is a radio frequency integrated circuit or a microwave monolithic integrated circuit.

16. A method of forming an inductor device in an integrated circuit having a first, a second, a third and a fourth metallization level, the method including the steps of:
    forming a first winding portion;
    forming a second winding portion;
    forming a first bridge portion electrically connecting the first winding portion to the second winding portion;
    forming a third winding portion; and
    forming a second bridge portion electrically connecting the second winding portion to the third winding portion;
    wherein the first winding portion and the second winding portion are substantially concentric in a plan view such that the first winding portion is substantially completely surrounded in the plan view by the second winding portion;
    wherein the second winding portion and the third winding portion are substantially concentric in the plan view such that the second winding portion is substantially completely surrounded in the plan view by the third winding portion;
    wherein each winding portion comprises a first metal line formed on the first metallization level and a second metal line formed on the second metallization level, the first metal line of a given winding portion being connected in parallel with the second metal line of the given winding portion; and
    wherein each bridge portion comprises a first metal line formed on the third metallization level and a second metal line formed on the fourth metallization level, the first metal line of a given bridge portion being connected in parallel with the second metal line of the given bridge portion.

17. The method of claim 16, wherein the integrated circuit is substantially formed using complimentary metal-oxide-semiconductor technology.

18. The method of claim 16, wherein forming the inductor device does not require more processing steps than are required to form the remainder of the integrated circuit.

19. The method of claim 16, wherein forming the inductor device comprises one or more damascene processes.

20. A telecommunications system comprising a base station and at least one wireless communication device configured to communicate with the base station, wherein the wireless communication device comprises at least one processing element comprising an integrated circuit having one or more inductor devices and a first, a second, a third and a fourth metallization level, at least one of the one or more inductor devices including:
   a first winding portion;
   a second winding portion;
   a first bridge portion electrically connecting the first winding portion to the second winding portion;
   a third winding portion; and
   a second bridge portion electrically connecting the second winding portion to the third winding portion;
   wherein the first winding portion and the second winding portion are substantially concentric in a plan view such that the first winding portion is substantially completely surrounded in the plan view by the second winding portion;
   wherein the second winding portion and the third winding portion are substantially concentric in the plan view such that the second winding portion is substantially completely surrounded in the plan view by the third winding portion;
   wherein each winding portion comprises a first metal line formed on the first metallization level and a second metal line formed on the second metallization level, the first metal line of a given winding portion being connected in parallel with the second metal line of the given winding portion; and
   wherein each bridge portion comprises a first metal line formed on the third metallization level and a second metal line formed on the fourth metallization level, the first metal line of a given bridge portion being connected in parallel with the second metal line of the given bridge portion.

21. The inductor device of claim 11, wherein the shield connecting portion further comprises a metal line disposed at an end of each extension opposite the center portion, and wherein the metal line of a given one of the plurality of extensions of the shield connecting portion overlies and is substantially parallel to the line-shaped portion of the given one of the shielding portions.

* * * * *

UNITED STATES PATENT AND TRADEMARK OFFICE
CERTIFICATE OF CORRECTION

| | |
|---|---|
| PATENT NO. | : 7,847,666 B2 |
| APPLICATION NO. | : 11/535501 |
| DATED | : December 7, 2010 |
| INVENTOR(S) | : Shahriar Moinian et al. |

It is certified that error appears in the above-identified patent and that said Letters Patent is hereby corrected as shown below:

Col. 7, line 21, please insert --connecting-- between the words "electrically" and "the".

Signed and Sealed this
Eighth Day of March, 2011

David J. Kappos
*Director of the United States Patent and Trademark Office*